(12) United States Patent
Chen et al.

(10) Patent No.: US 7,551,455 B2
(45) Date of Patent: Jun. 23, 2009

(54) PACKAGE STRUCTURE

(75) Inventors: Da-Jung Chen, Sanhe Village (TW); Yi-Cheng Lin, Yanpu Township, Pingtung County (TW); Bau-Ru Lu, Changhua (TW); Yi-Min Fang, Guanmiao Township, Tainan County (TW); Chau-Chun Wen, Pingjhen (TW); Chun-Tiao Liu, Hsinchu (TW)

(73) Assignee: Cyntec Co., Ltd., Hsinchu (TW)

( * ) Notice: Subject to any disclaimer, the term of this patent is extended or adjusted under 35 U.S.C. 154(b) by 245 days.

(21) Appl. No.: 11/482,370

(22) Filed: Jul. 7, 2006

(65) Prior Publication Data

US 2007/0257377 A1 Nov. 8, 2007

(30) Foreign Application Priority Data

May 4, 2006 (TW) .............................. 95115846 A

(51) Int. Cl.
*H05K 7/00* (2006.01)
(52) U.S. Cl. ........................ 361/777; 361/723; 174/255
(58) Field of Classification Search ................ 361/777, 361/813, 723; 174/260, 255; 257/777, 786; 438/123
See application file for complete search history.

(56) References Cited

U.S. PATENT DOCUMENTS

| | | | |
|---|---|---|---|
| 4,730,241 A | 3/1988 | Takaya | 363/19 |
| 5,847,951 A | 12/1998 | Brown et al. | 363/147 |
| 6,395,992 B1 * | 5/2002 | Nakayama et al. | 174/254 |
| 6,512,680 B2 | 1/2003 | Harada et al. | 361/777 |
| 6,911,353 B2 * | 6/2005 | Tani et al. | 438/68 |
| 6,940,724 B2 | 9/2005 | Divakar et al. | 361/719 |
| 2004/0090759 A1 * | 5/2004 | Kim | 361/790 |
| 2006/0139902 A1 * | 6/2006 | Happoya | 361/760 |
| 2007/0176278 A1 * | 8/2007 | Wang | 257/686 |
| 2008/0211082 A1 * | 9/2008 | Hirashima et al. | 257/692 |

FOREIGN PATENT DOCUMENTS

| | | |
|---|---|---|
| CN | 1458691 | 11/2003 |
| CN | 2696284 | 4/2005 |
| CN | 1674276 | 9/2005 |
| TW | 480631 | 3/2002 |
| TW | 544880 | 8/2003 |
| TW | 1234213 | 6/2005 |
| TW | 1244146 | 11/2005 |
| TW | 1246750 | 1/2006 |

* cited by examiner

*Primary Examiner*—Dean A. Reichard
*Assistant Examiner*—Yuriy Semenenko
(74) *Attorney, Agent, or Firm*—J.C. Patents

(57) ABSTRACT

A package structure including a first carrier, a second carrier, at least a first electronic component and at least a second electronic component is provided. The second carrier is electrically connected to the first carrier. The first electronic component is disposed on the first carrier and electrically connected to the first carrier. The second electronic component is disposed on the second carrier and electrically connected to the second carrier.

14 Claims, 3 Drawing Sheets

PACKAGE STRUCTURE

CROSS-REFERENCE TO RELATED APPLICATION

This application claims the priority benefit of Taiwan application serial no. 95115846, filed on May 4, 2006. All disclosure of the Taiwan application is incorporated herein by reference.

BACKGROUND OF THE INVENTION

1. Field of Invention

The present invention relates to a package structure, and more particularly, to a package structure with a plurality of carriers.

2. Description of Related Art

A package structure is a product formed through complicated packaging processes. Various package structures have different electrical performances and heat dissipation capacities, and a designer may select a package structure with suitable electrical performance and heat dissipation capacity according to design requirements.

Referring to FIG. 1, it is a schematic view of a conventional package structure. The conventional package structure 100 comprises a printed circuit board (PCB) 110 and a plurality of electronic components 120, wherein the electronic components 120 are disposed on a surface 112 of the PCB 110 and electrically connected to the PCB 110. The PCB 110 comprises a plurality of pins 116 protruding from the other surface 114 of the PCB 110. Through the pins 116, the PCB 110 may be electrically connected to a next level electronic device, such as a motherboard (not shown). However, the electronic components 120 of the conventional package structure 100 are all small sized first-level packages and the area for wiring on the surface 112 of the PCB 110 is limited, thereby resulting in a relatively large overall volume of the conventional structure 100. Additionally, since the electronic components 120 are required to be formed through a first-level packaging process, the manufacturing cost of the conventional package structure 100 is relatively high. Moreover, the package structure 100 must be manually inserted into the next level electronic device, so that both of them cannot be assembled together through an automatic machine.

In order to solve the above-mentioned problems, another conventional package structure is provided. Referring to FIG. 2, it is a schematic view of another conventional package structure. The conventional package structure 200 comprises a package substrate 210 and a plurality of electronic components 220, wherein the electronic components 220 are disposed on a surface 212 of the package substrate 210 and electrically connected to the package substrate 210 through wire bonding technology or surface mount technology. Additionally, the conventional package structure 200 is electrically connected to a next level electronic device, such as a motherboard (not shown), through a solder paste or a plurality of solder balls (not shown).

Although the conventional package structure 200 has advantages of high component distribution density, small volume, simple manufacturing process, relatively low cost, and being automatically placed onto a next level electronic device, when the conventional package structure 200 dissipates heat during operation, the heat is transferred to leads of the next level electronic device only through a conductive via 214 in the package substrate 210 by way of heat conduction. Therefore, the conventional package structure 200 has poor heat dissipation capacity.

SUMMARY OF THE INVENTION

An object of the present invention is to provide a package structure with a plurality of carriers.

In order to achieve the aforementioned or other objects, the present invention provides a package structure, which comprises a first carrier, a second carrier, at least a first electronic component and at least a second electronic component. The second carrier is electrically connected to the first carrier. The first electronic component is disposed on the first carrier and electrically connected to the first carrier. The second electronic component is disposed on the second carrier and electrically connected to the second carrier.

In one embodiment of the present invention, the first carrier may be disposed on the second carrier.

In one embodiment of the present invention, the first carrier may be disposed on the second carrier. Additionally, the second carrier comprises a first carrying area and a second carrying area, which are not in the same plane. The first carrier is disposed on the first carrying area and the second electronic component is disposed on the second carrying area.

In one embodiment of the present invention, the first carrier may be disposed on the second carrier. Additionally, the second carrier comprises a first carrying area and a second carrying area, which are not in the same plane. The first carrier is disposed on the first carrying area and the second electronic component is disposed on the second carrying area. Furthermore, there may be a plurality of the first electronic components disposed on two opposite surfaces of the first carrier.

In one embodiment of the present invention, the first carrier may be disposed beside the second carrier.

In one embodiment of the present invention, the first carrier may be disposed beside the second carrier. Additionally, the above package structure further comprises at least one bonding wire, wherein the first carrier is electrically connected to the second carrier via the bonding wire.

In one embodiment of the present invention, the above package structure further comprises an encapsulant, which at least encapsulates the first electronic component, the second electronic component, a part of the first carrier and a part of the second carrier.

In one embodiment of the present invention, the above package structure further comprises an encapsulant, which at least encapsulates the first electronic component, the second electronic component, a part of the first carrier and a part of the second carrier. Additionally, the first carrier comprises a plurality of bonding pads disposed on a surface of the first carrier and exposed outside the encapsulant.

In one embodiment of the present invention, the thermal resistance of the first carrier may be greater than that of the second carrier.

In one embodiment of the present invention, the thermal resistance of the first carrier may be greater than that of the second carrier. Additionally, the heat generation rate of the first electronic component may be smaller than that of the second electronic component.

In one embodiment of the present invention, the thermal resistance of the first carrier may be greater than that of the second carrier. Additionally, the heat generation rate of the first electronic component may be smaller than that of the second electronic component. Furthermore, the first electronic component may be a logic control component, a driving component or a passive component.

In one embodiment of the present invention, the thermal resistance of the first carrier may be greater than that of the second carrier. Additionally, the heat generation rate of the first electronic component may be smaller than that of the second electronic component. Furthermore, the second electronic component may be a metal-oxide-semiconductor field effect transistor (MOSFET), an insulated gate bipolar transistor (IGBT), a diode or a choke.

In one embodiment of the present invention, the thermal resistance of the first carrier may be greater than that of the second carrier. Additionally, the first carrier may be a wiring board.

In one embodiment of the present invention, the thermal resistance of the first carrier may be greater than that of the second carrier. Additionally, the second carrier may be a leadframe.

Based on the above description, since the second electronic components with greater heat generation rate are disposed on the second carrier with smaller thermal resistance, heat generated by the second electronic components during the operation of the package structure is directly transferred to a next level electronic device via the second carrier, such that the package structure will not be too hot to work normally. Furthermore, due to the relatively high wiring density in the first carrier, more first electronic components can be disposed on the first carrier, thereby making full use of the disposing space of the first carrier.

In order to make the aforementioned and other objects, features and advantages of the present invention comprehensible, preferred embodiments accompanied with FIGS. are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 3:
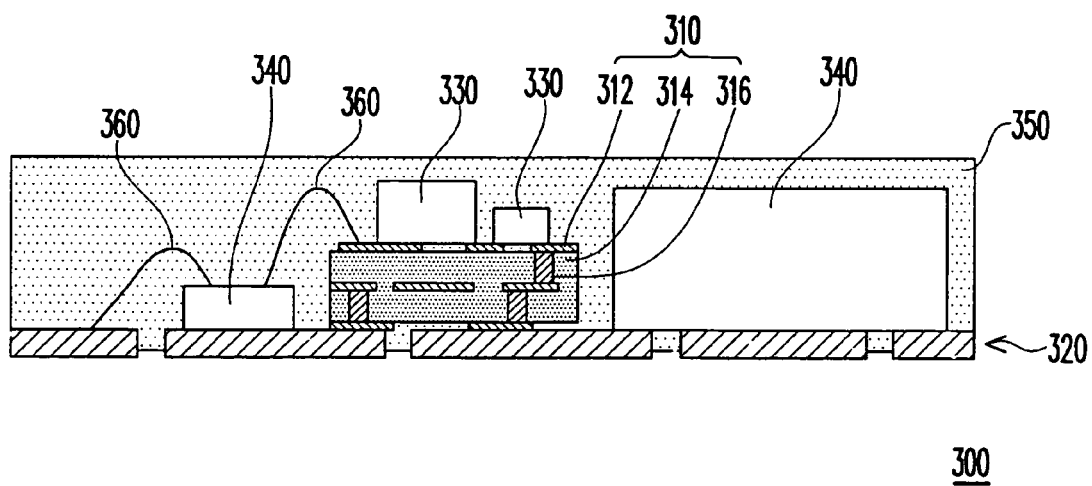
FIG. 3 is a schematic sectional view of a package structure according to the first embodiment of the present invention.

Referring FIG. 3, it is a schematic sectional view of a package structure according to the first embodiment of the present invention. The package structure 300 in the first embodiment comprises a first carrier 310, a second carrier 320, at least a first electronic component 330 (for example, two first electronic components are shown in FIG. 3), and at least a second electronic component 340 (for example, two second electronic components are shown in FIG. 3). The second carrier 320 is electrically connected to the first carrier 310, and the thermal resistance of the first carrier 310 may be greater than that of the second carrier 320. The first electronic components 330 are disposed on the first carrier 310 and electrically connected to the first carrier 310. The second electronic components 340 are disposed on the second carrier 320 and electrically connected to the second carrier 320. The heat generation rate of each first electronic component 330 may be smaller than that of each second electronic component 340.

In the first embodiment, the first carrier 310 may be disposed on the second carrier 320. Additionally, the package structure 300 further comprises an encapsulant 350 that at least encapsulates the first electronic components 330, the second electronic components 340, a part of the first carrier 310 and a part of the second carrier 320. Referring to FIG. 3, a part of the region of the second carrier 320 is exposed outside the encapsulant 350, which is used to electrically connect to a next level electronic device, such as a motherboard (not shown). Besides the aforementioned function, when the package structure 300 generates heat during operation, the second carrier 320 transfers the heat to the next level device via the exposed region. Additionally, the encapsulant 350 is formed by potting and heating in a mold (not shown). The encapsulant 350 may be used for protecting the encapsulated components from being influenced by the external temperature, moisture and noise, and providing a shape for being held by human hand.

In the first embodiment, the first electronic components 330 may be logic control components, driving components or passive components; and the second electronic components 340 may be MOSFETs, IGBTs, diodes or chokes (e.g., inductors). For example, in FIG. 3, one of the second electronic components 340, e.g., an MOSFET, may be electrically connected to the first carrier 310 and the second carrier 320 through a plurality of bonding wires 360 respectively. In other words, one of the second electronic components 340 is electrically connected to the second carrier 320 through the wire bonding technology. In FIG. 3, the other second electronic component 340, e.g., a choke, may be electrically connected to the second carrier 320 via the solder paste. In other words, the other second electronic component 340 is electrically connected to the second carrier 320 through the surface mount technology. It should be mentioned herein that the second electronic components 340 may be electrically connected to the second carrier 320 through the wire bonding technology, the surface mount technology, or flip chip bonding technology according to design requirements. The first electronic components 330 may be electrically connected to the first carrier 310 through the above-mentioned technologies according to design requirements, too. Accordingly, the first embodiment is only intended to demonstrate but not to limit the present invention.

Furthermore, the first carrier 310 may be a wiring board and the second carrier 320 may be a leadframe made of, for example, metal. The first carrier 310, for example, a wiring board is formed by alternately laminating a plurality of wiring layers 312 and a plurality of dielectric layers 314, and at least two wiring layers 312 are electrically connected with each other through at least one conductive via 316. Therefore, the wiring density in the first carrier 310, for example, a wiring board is relatively high and the wiring is relatively complicated. It should be mentioned herein that the appearances of the first carrier 310 and the second carrier 320 may be changed according to design requirements, and the first embodiment is only intended to demonstrate but not to limit the present invention.

Figure 1:
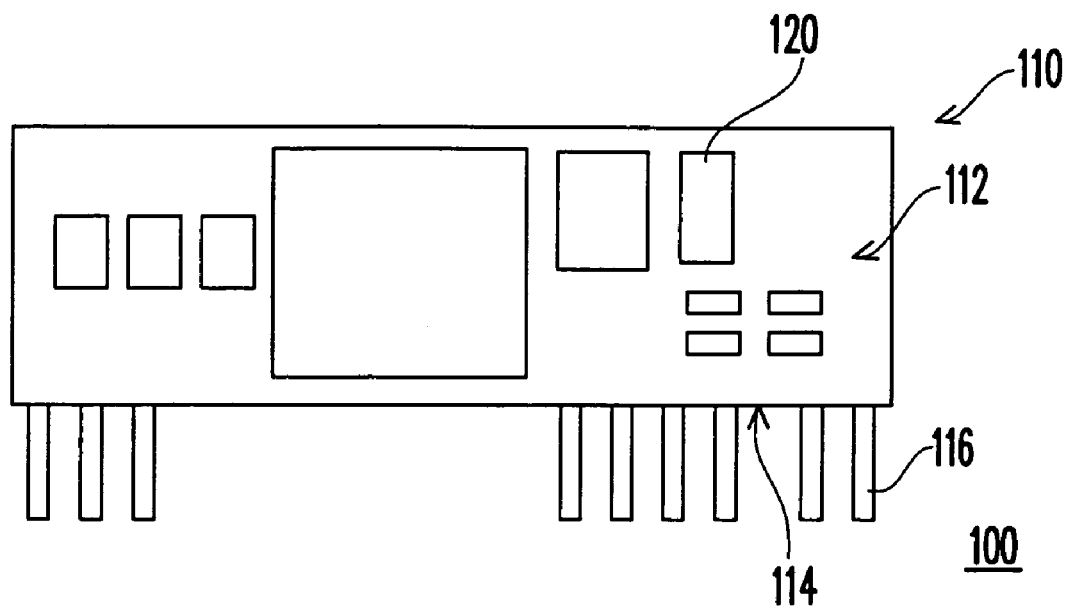
FIG. 1 is a schematic view of a conventional package structure.
Figure 2:
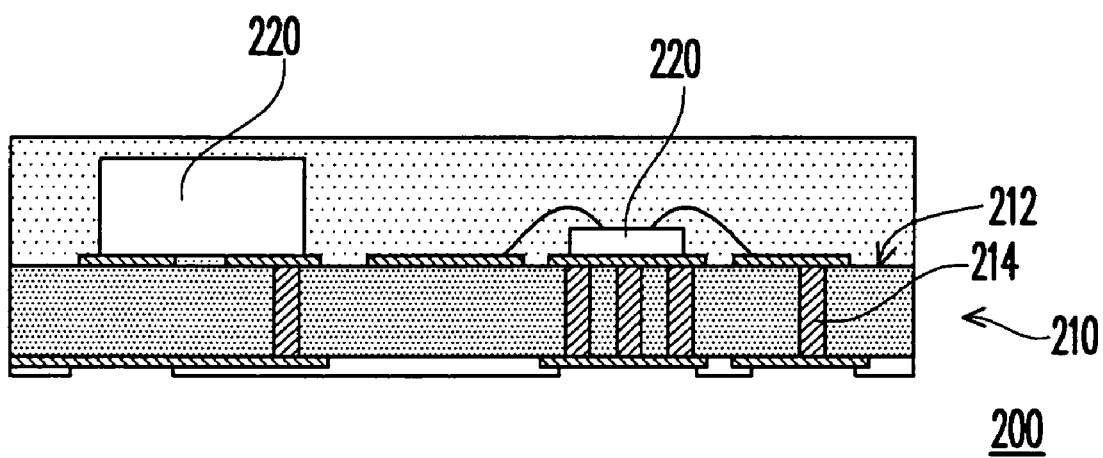
FIG. 2 is a schematic view of another conventional package structure.

Based on the above description, since the second electronic components 340 with greater heat generation rate are disposed on the second carrier 320 with smaller thermal resistance, heat generated by the second electronic components 340 during the operation of the package structure 300 is directly transferred to the next level electronic device via the second carrier 320, such that the package structure 300 will not be too hot to work normally. Compared with the conventional package structure 200 (shown in FIG. 2), the package structure 300 in the first embodiment has more preferable heat dissipation capacity. Additionally, due to the relatively high wiring density in the first carrier 310, more first electronic components 330 can be disposed on the first carrier 310, thereby making full use of the disposing space of the first carrier 310. Compared with the conventional package structure 100 (shown in FIG. 1), the volume of the package structure 300 in the first embodiment is much smaller.

Second Embodiment

Figure 4:
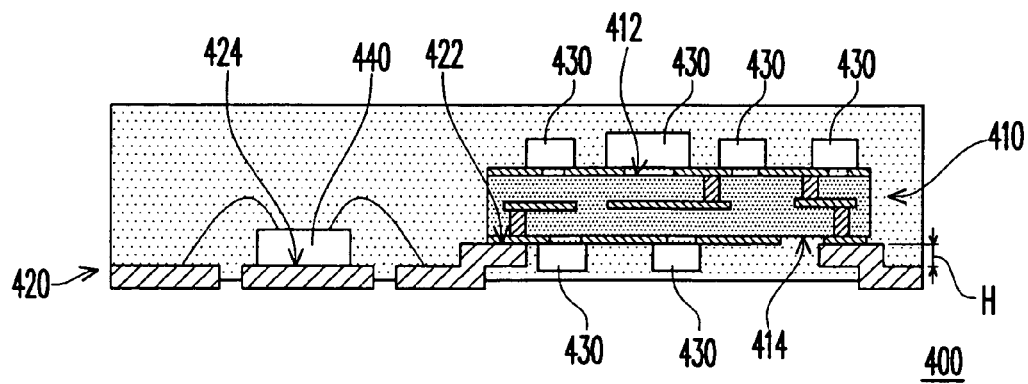
FIG. 4 is a schematic sectional view of a package structure according to the second embodiment of the present invention.

Referring to FIGS. 3 and 4, FIG. 4 is a schematic sectional view of a package structure according to the second embodiment of the present invention. The package structure 400 in the second embodiment mainly differs from the package structure 300 in the first embodiment in that, the first electronic components 430 may be disposed on two opposite surfaces 412 and 414 of the first carrier 410. In the second embodiment, the first carrier 410 may be still disposed on the second carrier 420. The second carrier 420 comprises a first carrying area 422 and a second carrying area 424, which are not in the same plane. Particularly, as for the relative position shown in FIG. 4, there is a height difference H between the second carrying area 424 and the first carrying area 422. Additionally, the first carrier 410 is disposed on the first carrying area 422 and the second electronic components 440 are disposed on the second carrying area 424.

Since the first electronic components 430 are disposed on two opposite surfaces 412 and 414 of the first carrier 410, compared with the first embodiment, more first electronic components 430 are disposed on the first carrier 410 in the second embodiment, i.e., the first carrier 410 has a larger disposing space.

Third Embodiment

Figure 5:
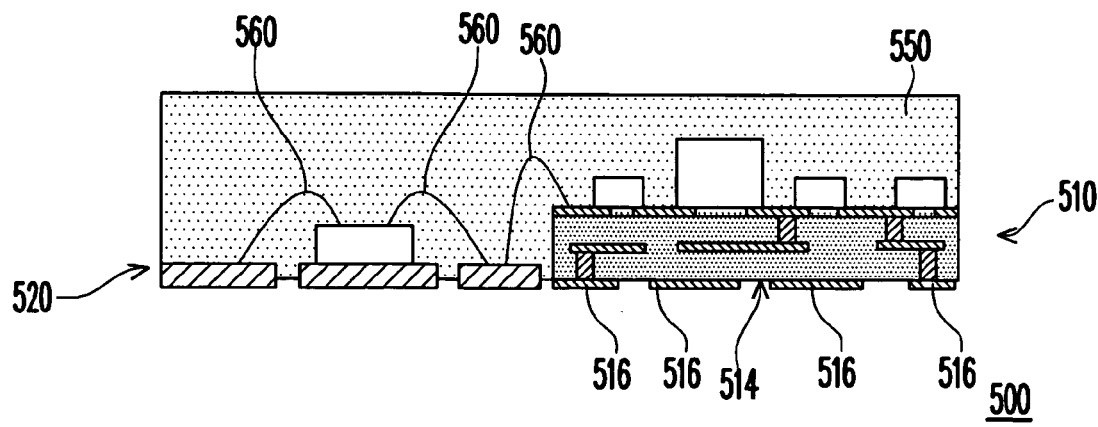
FIG. 5 is a schematic sectional view of a package structure according to the third embodiment of the present invention.

Referring to FIGS. 3, 4, and 5, FIG. 5 is a schematic sectional view of a package structure according to the third embodiment of the present invention. The package structure 500 in the third embodiment mainly differs from the package structures 300 and 400 in the above-mentioned embodiments in that, the first carrier 510 in the third embodiment may be disposed beside the second carrier 520. Additionally, the package structure 500 further comprises at least one bonding wire 560 (three bonding wires are shown in FIG. 5) and the first carrier 510 is electrically connected to the second carrier 520 via at least one of the bonding wires 560. Additionally, the first carrier 510 comprises a plurality of bonding pads 516 disposed on a surface 514 of the first carrier 510 and exposed outside the encapsulant 550. Compared with the above-mentioned embodiments, the bonding pads 516 exposed outside the encapsulant 550 in the third embodiment are used for transmitting electric signals to the next level electronic device, such as a motherboard (not shown), thereby increasing channels for electrically connecting the package structure 500 to the next level electronic device.

Figure 6:
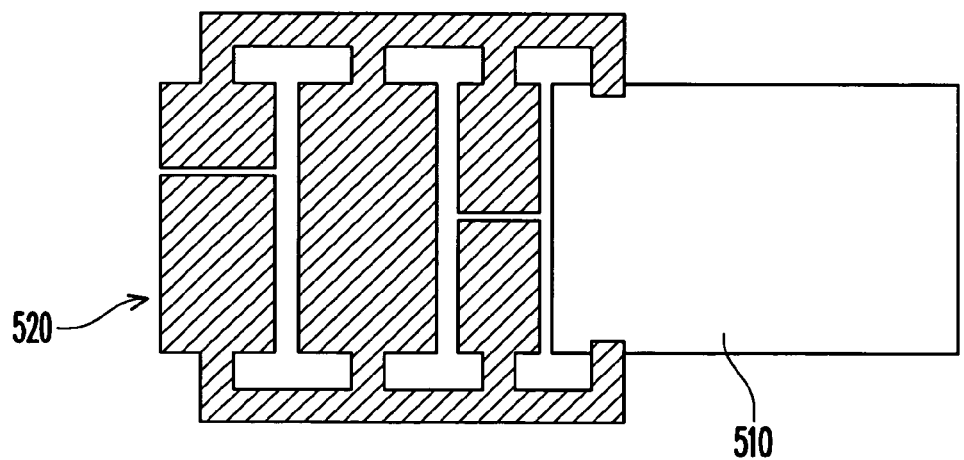
FIG. 6 is a schematic view of the connection relationship between the first and second carriers in FIG. 5 before the package structure is formed.

It should be noted that, referring to FIGS. 5 and 6, FIG. 6 is a schematic view of the connection relationship between the first and second carriers in FIG. 5 before the package structure is formed. Before the package structure 500 shown in FIG. 5 is formed, the first carrier 510 and the second carrier 520 are connected to each other by way of welding, soldering or adhering, that is, the materials such as solder or glue may be used as the medium for connecting the first carrier 510 to the second carrier 520. Connecting the first carrier 510 to the second carrier 520 aims at facilitating the subsequent processes, such as die bonding, wire bonding and encapsulant forming.

Next, after the encapsulant 550 has been formed, the trimming process is generally performed to cut off the part between the first carrier 510 and the second carrier 520 where they are originally connected. With the above steps, the package structure 500 is completely formed. It should be mentioned herein that the first carrier 510 and the second carrier 520 of the package structure 500 are finally electrically connected with each other via at least one of the bonding wires 560, and the encapsulant 550 is used for maintaining the relative positions between the first carrier 510 and the second carrier 520 and providing a shape for being held by human hand.

In summary, the package structure of the present invention at least has the following advantages.

1. Since the second electronic components with greater heat generation rate are disposed on the second carrier with smaller thermal resistance, heat generated by the second electronic components during the operation of the package structure is directly transferred to a next level electronic device via the second carrier, such that the package structure will not be too hot to work normally.

2. Due to the relatively high wiring density in the first carrier, more first electronic components can be disposed on the first carrier, thereby making full use of the disposing space of the first carrier.

3. Since the disposing space of the first carrier is fully made use of, the package structure of the present invention is relatively small in volume.

4. Since the package structure of the present invention may be electrically connected to a next level electronic device through the surface mount technology, the package structure of the present invention can be automatically assembled with the next level electronic device, thereby enhancing the yield and reducing the assembling cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
   a first carrier;
   a second carrier, electrically connected to the first carrier and disposed under the first carrier, wherein the second carrier comprises a plurality of first carrying areas and a second carrying area, and the first carrying areas are not in the same plane with the second carrying area, wherein the first carrier is supported by two of the first carrying areas adjacent to each other, and a surface of the first carrier is exposed by an opening between the two first carrying areas;
   a plurality of first electronic components, disposed on the first carrier and electrically connected to the first carrier; and at least a second electronic component, disposed on the second carrying area of the second carrier and electrically connected to the second carrier.

2. The package structure as claimed in claim 1, wherein the first electronic components are disposed on two opposite surfaces of the first carrier.

3. The package structure as claimed in claim 1, wherein the first carrier is disposed beside the second carrier.

4. The package structure as claimed in claim 3, further comprising at least one bonding wire, wherein the first carrier is electrically connected to the second carrier via the bonding wire.

5. The package structure as claimed in claim 1, further comprising an encapsulant used for at least encapsulating the first electronic components, the second electronic component, the first carrier and a part of the second carrier.

6. The package structure as claimed in claim 5, wherein the first carrier comprises a plurality of bonding pads disposed on a surface of the first carrier and exposed outside the encapsulant.

7. The package structure as claimed in claim 1, wherein the thermal resistance of the first carrier is greater than that of the second carrier.

8. The package structure as claimed in claim 7, wherein the heat generation rate of the first electronic components is smaller than that of the second electronic component.

9. The package structure as claimed in claim 8, wherein the first electronic components are logic control components, driving components or passive components.

10. The package structure as claimed in claim 8, wherein the second electronic component is a metal-oxide-semiconductor field effect transistor (MOSFET), an insulated gate bipolar transistor (IGBT), a diode or a choke.

11. The package structure as claimed in claim 7, wherein the first carrier is a wiring board.

12. The package structure as claimed in claim 7, wherein the second carrier is a leadframe.

13. The package structure as claimed in claim 1, wherein at least one of the first electronic components is disposed on the exposed surface of the first carrier.

14. The package structure as claimed in claim 1, wherein the second carrying area is disposed on a lower plane than the first carrying areas.

* * * * *